United States Patent
Brisbin et al.

(10) Patent No.: US 7,645,657 B2
(45) Date of Patent: Jan. 12, 2010

(54) MOS TRANSISTOR AND METHOD OF FORMING THE MOS TRANSISTOR WITH A SiON ETCH STOP LAYER THAT PROTECTS THE TRANSISTOR FROM PID AND HOT CARRIER DEGRADATION

(75) Inventors: Douglas Brisbin, San Jose, CA (US); Prasad Chaparala, Sunnyvale, CA (US); Denis Finbarr O'Connell, Palo Alto, CA (US); Heather McCulloh, Kennebunk, ME (US); Sergei Drizlikh, Scarborough, ME (US)

(73) Assignee: National Semiconductor Corporation, Santa Clara, CA (US)

( * ) Notice: Subject to any disclaimer, the term of this patent is extended or adjusted under 35 U.S.C. 154(b) by 54 days.

(21) Appl. No.: 12/001,370

(22) Filed: Dec. 10, 2007

(65) Prior Publication Data
US 2009/0146192 A1    Jun. 11, 2009

(51) Int. Cl.
*H01L 21/336* (2006.01)
(52) U.S. Cl. .................. 438/197; 438/154; 438/257; 438/586; 438/597; 438/724; 438/738; 438/778; 257/E21.579
(58) Field of Classification Search .............. None
See application file for complete search history.

(56) References Cited

U.S. PATENT DOCUMENTS 6,413,885 B2    7/2002    Yao et al. .................. 438/786
6,483,153 B1 *  11/2002   Hui et al. .................. 257/382
2002/0163037 A1 * 11/2002 Kim et al. .................. 257/336
2005/0255659 A1 * 11/2005 Wu et al. .................. 438/299

OTHER PUBLICATIONS

Douglas Brisbin, Yuri Mirgorodski and Prasad Chaparala, "Anomalous NMOSFET Hot Carrier Degradation Due to Hole Injection in a DGO CMOS Process", Integrated Reliability Workshop Final Report, 2004 IEEE International, Oct. 18-21, 2004, pp. 102-108.

Douglas Brisbin, Yuri Mirgorodski and Prasad Chaparala, Anomalous NMOSFET Hot Carrier Degradation Due to Trapped Positive Charge in a DGO CMOS Process, 43rd Annual International Reliability Physics Symposium, Apr. 17-21, 2005, pp. 269-274.

U.S. Appl. No. 10/912,660, filed Aug. 5, 2004 to McCulloh et al. for Method and Apparatus for Reducing Plasma Induced Damage In Integrated Circuits.

* cited by examiner

*Primary Examiner*—N Drew Richards
*Assistant Examiner*—Kyoung Lee
(74) *Attorney, Agent, or Firm*—Mark C. Pickering

(57) ABSTRACT

A MOS transistor is formed with a dual-layer silicon oxynitride (SiON) etch stop film that protects the transistor from plasma induced damage (PID) and hot carrier degradation, thereby improving the reliability of the transistors. The first SiON layer is formed with $SiH_4$ at a first flow rate, and the second SiON layer is formed with $SiH_4$ at a second higher flow rate.

20 Claims, 5 Drawing Sheets

MOS TRANSISTOR AND METHOD OF FORMING THE MOS TRANSISTOR WITH A SION ETCH STOP LAYER THAT PROTECTS THE TRANSISTOR FROM PID AND HOT CARRIER DEGRADATION

BACKGROUND OF THE INVENTION

1. Field of the Invention

The present invention relates to MOS transistors and, more particularly, to a MOS transistor and a method of forming the MOS transistor with a SiON etch stop layer that protects the transistor from plasma induced damage (PID) and hot carrier degradation.

2. Description of the Related Art

A MOS transistor is a semiconductor device that can be fabricated in many well known ways. In one prior art approach, an etch stop layer of silicon oxynitride (SiON) is formed over the device after the source and drain regions and the gate of the device have been silicided. In this approach, the SiON etch stop layer performs two important functions.

First, the SiON layer provides a conductive path to ground that prevents plasma induced damage (PID). PID results when plasma etching is used, and can lead to the build up of a charge on the transistor gate that, if not discharged, can seriously damage or destroy the underlying gate oxide layer. Second, when the contact openings are subsequently formed, the SiON etch stop layer eliminates harmful over-etching of the silicided layers that can be caused by variations in the thickness of an overlying layer of dielectric material.

FIGS. 1A-1D show a series of cross-sectional views that illustrate a prior-art method 100 of fabricating a MOS transistor with a SiON etch stop layer. As shown in FIG. 1A, method 100 utilizes a conventionally-formed MOS device 110 that includes a semiconductor material 112 of a first conductivity type, and spaced-apart source and drain regions 114 and 116 of a second conductivity type that are formed in semiconductor material 112.

MOS device 110 also includes a channel region 118 that lies between the source and drain regions 114 and 116, a gate oxide layer 120 that lies over channel region 118, and a gate 122 that is formed on gate oxide layer 120 over channel region 118. MOS device 110 further includes a non-conductive side wall spacer 124 that contacts the side walls of gate 122, and metal silicide layers 130, 132, and 134 that are formed on source region 114, drain region 116, and gate 122, respectively.

As further shown in FIG. 1A, method 100 begins by forming a SiON etch stop layer 140 on side wall spacer 124 and metal silicide layers 130, 132, and 134. The TABLE below illustrates two SiON deposition recipes. In the Table, RI(n) is the film's index of refraction, and RI(k) is the film's extinction coefficient.

However, the silane ($SiH_4$) flow rate used during SiON film deposition is critical to controlling the effects of PID. NMOS transistors formed with high $SiH_4$ flow rate levels, such as 115 sccm, have been found to resist plasma charging effects because a high $SiH_4$ flow rate level increases the

TABLE

| | Low K SiON | High K SiON |
| --- | --- | --- |
| RI (n) | 2.2 | 2.0 |
| RI (k) | 1.02 | 1.62 |
| Thickness | 500 Å | 500 Å |
| RF Power | 120 W | 120 W |
| Pressure | 5.5 Torr | 5.5 Torr |
| $SiH_4$ Flow | 54 sccm | 115 sccm |
| $N_2O$ Flow | 70 sccm | 70 sccm |
| Argon Flow | 1900 sccm | 1900 sccm | conductance of the SiON film. On the other hand, NMOS transistors formed with low $SiH_4$ flow rate levels, such as 54 sccm, have been found to be susceptible to plasma charging effects because a low $SiH_4$ flow rate level reduces the conductance of the SiON film.

FIG. 2 shows a prior-art graph that illustrates SiON film conduction versus $SiH_4$ deposition flow rate. As shown in FIG. 2, as the $SiH_4$ deposition flow rate increases from 50 sccm to 120 sccm, the SiON film conductance increases by about three orders of magnitude from approximately $1 \times 10^{-12}$ to $1 \times 10^{-9} \Omega^{-1}$. Thus, when formed at a $SiH_4$ flow rate of 115 sccm, the resulting SiON etch stop layer provides a much more conductive path.

A SiON layer formed at a $SiH_4$ flow rate of 115 sccm is conductive on the order of femto-amps at room temperature and nano-amps at elevated processing temperatures which, although small, is sufficient to provide a grounding path for any plasma induced charge that has built up on gate 122. Thus, in the present example, method 100 utilizes a $SiH_4$ flow rate of 115 sccm. As a result, one advantage of SiON layer 140 is that layer 140 eliminates the possibility of damage that can result from plasma induced charge build up.

Referring again to FIG. 1A, once SiON etch stop layer 140 has been formed, an overlying dielectric layer 142, such as a layer of tetraethylorthosilicate (TEOS), is formed on etch stop layer 140. After overlying dielectric layer 142 has been formed, a mask 144 is formed and patterned on the top surface of dielectric layer 142.

Next, as shown in FIG. 1B, the exposed regions of dielectric layer 142 are etched to form openings 146, 148, and 149. The etch continues until the exposed regions of dielectric layer 142 have been removed from etch stop layer 140 so that openings 146, 148, and 149 expose regions of the top surface of etch stop layer 140.

As a result, dielectric layer 142 can be significantly over-etched to insure that all of exposed dielectric layer 142 has been removed. Thus, another advantage of SiON layer 140 is that at the end of the etch, regardless of any variations in the thickness of dielectric layer 142, which can be significant, the bottoms of openings 146, 148, and 149 lie approximately the same distance from the top surfaces of source region 114, drain region 116, and gate 122, respectively. As a result, method 100 can accommodate contact openings in layer 142 of differing depths.

As shown in FIG. 1C, after openings 146, 148, and 149 have been formed in dielectric layer 142, the exposed regions of SiON etch stop layer 140 are etched away to form openings 150, 152, and 153. In the present example, an etch chemistry is used to remove etch stop layer 140 at a substantially slower rate than dielectric layer 142 was removed.

The etch continues until etch stop layer 140 has been removed to expose regions on the top surfaces of metal silicide layers 130, 132, and 134. After the etch, mask 144 is removed. Once mask 144 has been removed, a metal contact layer is deposited on dielectric layer 142 to fill up openings 150, 152, and 153. Following the deposition of the metal contact layer, the metal contact layer is next planarized until the metal contact layer has been removed from the top surface of dielectric material 142.

As shown in FIG. 1D, the planarization forms a metal source contact 154, a metal drain contact 156, and a metal gate contact 158 in dielectric layer 142 that make electrical connections with source region 114, drain region 116, and gate 122, respectively. After this, method 100 continues with conventional back-end processing steps to complete the formation of a MOS transistor.

One problem with method 100 when using a SiH$_4$ flow rate of 115 sccm during the formation of SiON etch stop layer 140 is that the resulting MOS transistor is more susceptible to hot carrier injection. This, in turn, accelerates the hot carrier degradation of the transistor. Hot carrier injection causes device parameters, such as the saturation drain current ($I_{DSAT}$), to degrade with time. Degradation in the $I_{DSAT}$ of a transistor leads to a reduction in digital circuit speed and potential functional failure. The NMOS transistor is particularly prone to hot carrier damage.

FIG. 3 shows a prior-art graph that illustrates the hot carrier degradation of an NMOS transistor fabricated with method 100 when using a SiH$_4$ flow rate of 120 sccm. As shown in FIG. 3, the graph illustrates a measured saturated drain current $I_{DSAT}$, and an estimated saturated drain current $I_{DES}$ over a number of stress times against $I_{DSAT}$ degradation. (Further, the $I_{DSAT}$ values are measured at $V_{GS}=V_{DS}=3.3V$, and the device is stressed at $V_{GS}$ stress=1.97V and $V_{DS}$ stress=3.9V.)

As further shown in FIG. 3, for stress times less than 10 ks, the measured saturated drain current $I_{DSAT}$ and the estimated saturated drain current $I_{DES}$ are substantially the same (indicating that the measured saturated drain current $I_{DSAT}$ is degrading with the expected power law dependence).

On the other hand, for stress times between 10 ks and 100 ks, the measured saturated drain current $I_{DSAT}$ improves dramatically when compared to the estimated saturated drain current $I_{DES}$. However, for stress times greater than 100 ks, the measured saturated drain current $I_{DSAT}$ declines rapidly when compared to the estimated saturated drain current $I_{DES}$, leading to premature failure. Thus, if failure occurs when degradation reaches 10%, a NMOS transistor formed with a SiH$_4$ flow rate of 120 sccm will fail earlier than predicted due to hot carrier effects.

The increased susceptibility to hot carrier injection is associated with the incorporation of additional hydrogen at the silicon-gate oxide (Si—SiO$_2$) interface during device processing. One source of the addition hydrogen comes from the increased levels of hydrogen that are present when a high SiH$_4$ flow rate level is used in the formation of SiON etch stop layer 140. The Si—H bond, however, is weak (bond strength approximately 0.3 eV), and can be easily broken by hot carrier generated injected electrons.

FIG. 4 shows a prior-art graph that illustrates an example of the hot carrier degradation of an NMOS transistor fabricated with a series of SiH$_4$ flow rate levels. The graph illustrates a series of measured saturated drain currents $I_{DSAT1}$-$I_{DSAT6}$ taken from NMOS transistors formed with the series of SiH$_4$ flow rate levels, along with an estimated saturated drain current $I_{DES}$, taken over a number of stress times against $I_{DSAT}$ degradation. (The $I_{DSAT}$ values are measured at $V_{GS}=V_{DS}=3.3V$ and the device stressed at $V_{GS}$ stress=2.13V, and $V_{DS}$ stress=4.3V.)

As shown in FIG. 4, the series of measured saturated drain currents $I_{DSAT1}$-$I_{DSAT6}$ vary based on the flow rate of SiH$_4$ that is used during the formation of SiON etch stop layer 140. In the FIG. 4 example, the series of measured saturated drain currents $I_{DSAT1}$-$I_{DSAT6}$ correspond with the series of SiH$_4$ flow rates 50 sccm, 70 sccm, 80 sccm, 90 sccm, 100 sccm, and 120 sccm, respectively.

As further shown in FIG. 4, for the SiH$_4$ flow rate of 50 sccm, the measured saturated drain currents $I_{DSAT1}$ substantially tracks the estimated saturated drain current $I_{DES}$. For the SiH$_4$ flow rates of 70-80 sccm, the measured saturated drain currents $I_{DSAT2}$ and $I_{DSAT3}$ substantially track the estimated saturated drain current $I_{DES}$ for stress times up to about 7 ks, and then have improved degradation rates for stress times from 7 ks to about 14 ks, and worse degradation rates over 14 ks when compared to the estimated saturated drain current $I_{DES}$.

However, for the SiH$_4$ flow rates of 90, 100, and 120 sccm, the measured saturated drain currents $I_{DSAT4}$, $I_{DSAT5}$, and $I_{DSAT6}$ track the estimated saturated drain current $I_{DES}$ for stress times of approximately 4 ks, and then have improved degradation rates for stress times from 4 ks to about 11 ks, and worse degradation rates over 11 ks when compared to the estimated saturated drain current $I_{DES}$. Thus, if failure occurs when degradation reaches 10%, a NMOS transistor formed with a SiH$_4$ flow rate of 90-120 sccm will fail earlier than predicted due to hot carrier effects.

As noted above, however, a 50 sccm SiH$_4$ flow forms a SiON layer that provides very low conductivity. Thus, although a SiH$_4$ flow rate of 50 sccm corresponds with a measured saturated drain current $I_{DSAT1}$ that substantially tracks the estimated saturated drain current $I_{DES}$, a SiH$_4$ flow rate of 50 sccm produces a SiON layer which is susceptible to plasma induced charge on gate 122 due to the low conductivity.

One approach to this problem is to select an intermediate SiH$_4$ flow rate. For example, a flow rate of approximately 70-80 sccm produces a SiON film that is one order of magnitude more conductive (approximately $1\times10^{-11}\Omega^{-1}$) which reduces the effects of PID. In addition, SiH$_4$ flow rates of 70 and 80 sccm produce acceptable measured saturated drain currents (e.g., $I_{DSAT2}$ and $I_{DSAT3}$) when failure is defined at a degradation of 10%.

However, although SiH$_4$ flow rates of approximately 70-80 sccm provide an improved conductivity when compared to a flow rate of 50 sccm, there is a need for much greater conductivity to fully protect against the effects of PID.

DETAILED DESCRIPTION OF THE INVENTION

Figure 5A:
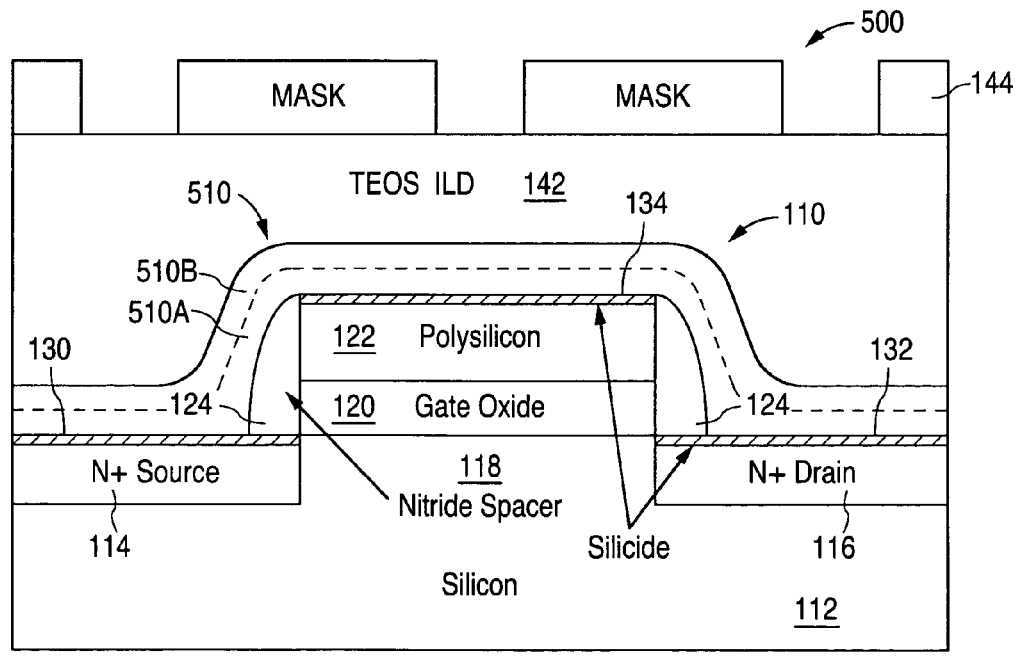
FIGS. 5A-5B are cross-sectional views illustrating a method 500 of forming a MOS transistor in accordance with the present invention.
Figure 5B:
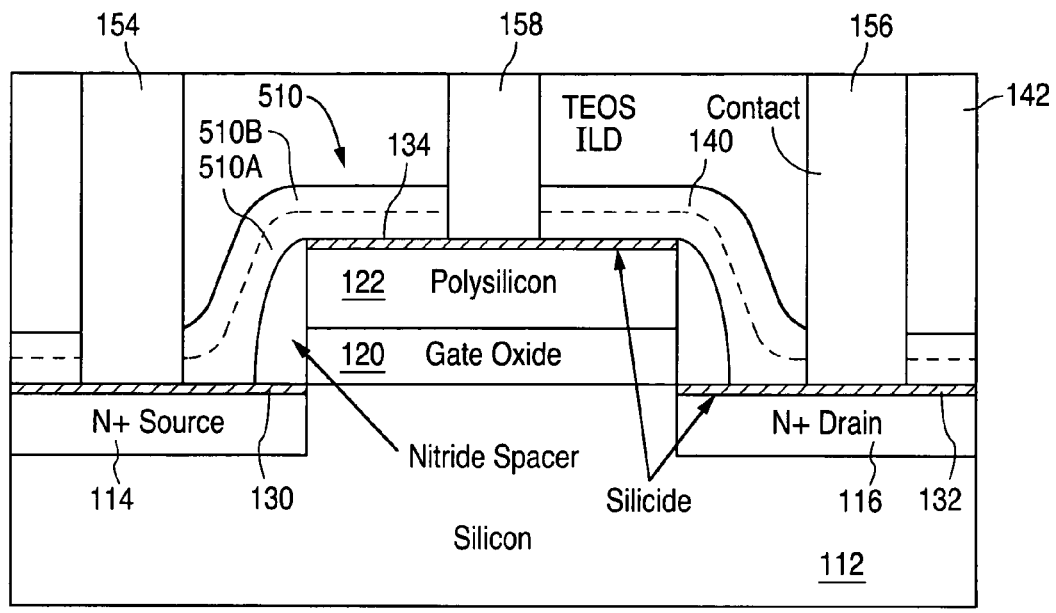

FIGS. 5A-5B show cross-sectional views that illustrate a method 500 of forming a MOS transistor in accordance with the present invention. As described in greater detail below, the present invention forms a MOS transistor with a dual-layer SiON etch stop film that protects the transistor from plasma induced damage (PID) and hot carrier degradation, and thereby improves the reliability of the transistor.

Method 500 is similar to method 100 and, as a result, utilizes the same reference numerals to designate the elements that are common to both methods. As shown in FIGS. 5A-5B, method 500 differs from method 100 in that method 500 forms a SiON etch stop layer 510 in lieu of SiON etch stop layer 140.

In accordance with the method of the present invention, SiON etch stop layer 510 is formed by first forming a lower SiON etch stop layer 510A to have a thickness of approximately 250 Å. Lower etch stop layer 510A is formed with a deposition recipe that includes a silane ($SiH_4$) flow rate that lies within a range of approximately 30-85 sccm, $N_2O$ at a flow rate of approximately 70 sccm, and a neutral gas, such as argon, at a flow rate of approximately 1900 sccm. For example, the low K SiON recipe in the TABLE above with a $SiH_4$ flow rate of 54 sccm can be used to form SiON etch stop layer 510A.

It is critical that the $SiH_4$ flow rate used to form layer 510A not exceed about 85 sccm when failure is defined as exceeding a degradation of 10% because a greater flow rate will lead to premature failure due to hot carrier degradation. If failure is defined as exceeding a higher level, such as a degradation exceeding 15%, then it is critical that the $SiH_4$ flow rate not exceed about 55 sccm because a greater flow rate will also lead to premature failure.

In accordance with the present invention, by forming lower SiON etch stop layer 510A with, for example, a $SiH_4$ flow rate of 50 sccm, lower SiON layer 510A is formed with a small amount of hydrogen. As a result, few if any additional Si—H bonds are formed at the Si—$SiO_2$ interface, the saturated drain current $I_{DSAT}$ and the estimated saturated drain current $I_{DES}$ are substantially identical, and the hot carrier degradation occurs as expected.

Following this, an upper SiON etch stop layer 510B is formed to have a thickness of approximately 250 Å. Upper etch stop layer 510B is formed with a deposition recipe that includes a $SiH_4$ flow rate that lies within a range of approximately 110-120 sccm. For example, the high K SiON recipe in the TABLE above with a $SiH_4$ flow rate of 115 sccm can be used to form SiON etch stop layer 510B.

Figure 1A:
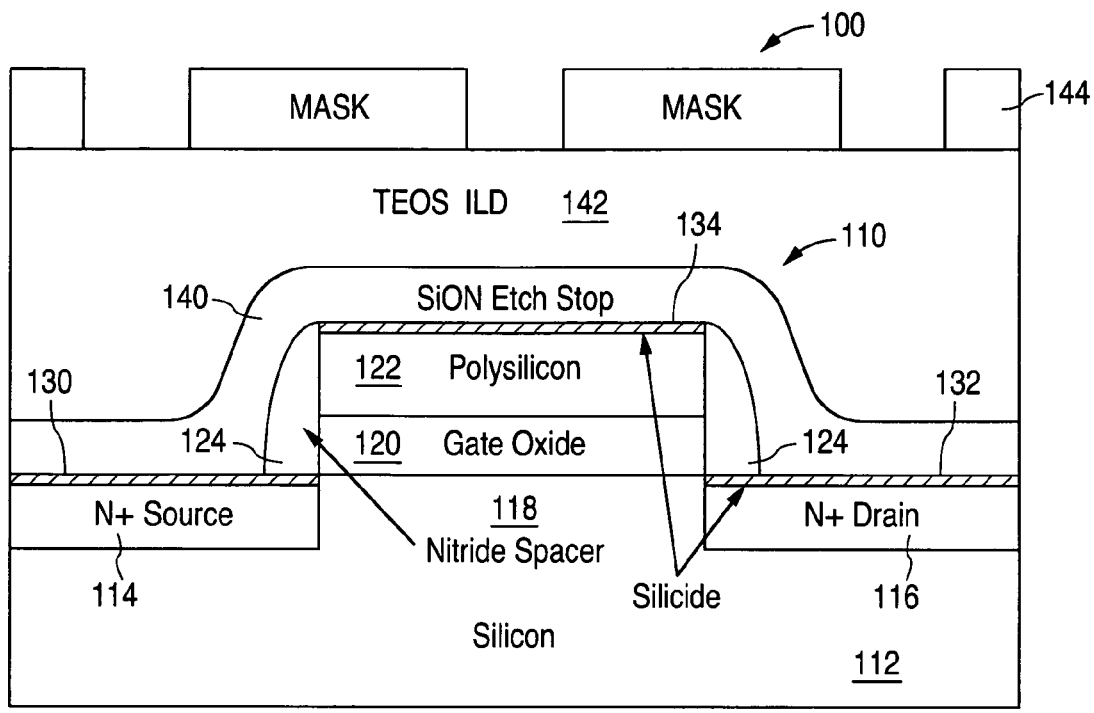
FIGS. 1A-1D are a series of cross-sectional views illustrating a prior-art method 100 of fabricating a MOS transistor with an SiON etch stop layer.
Figure 1B:
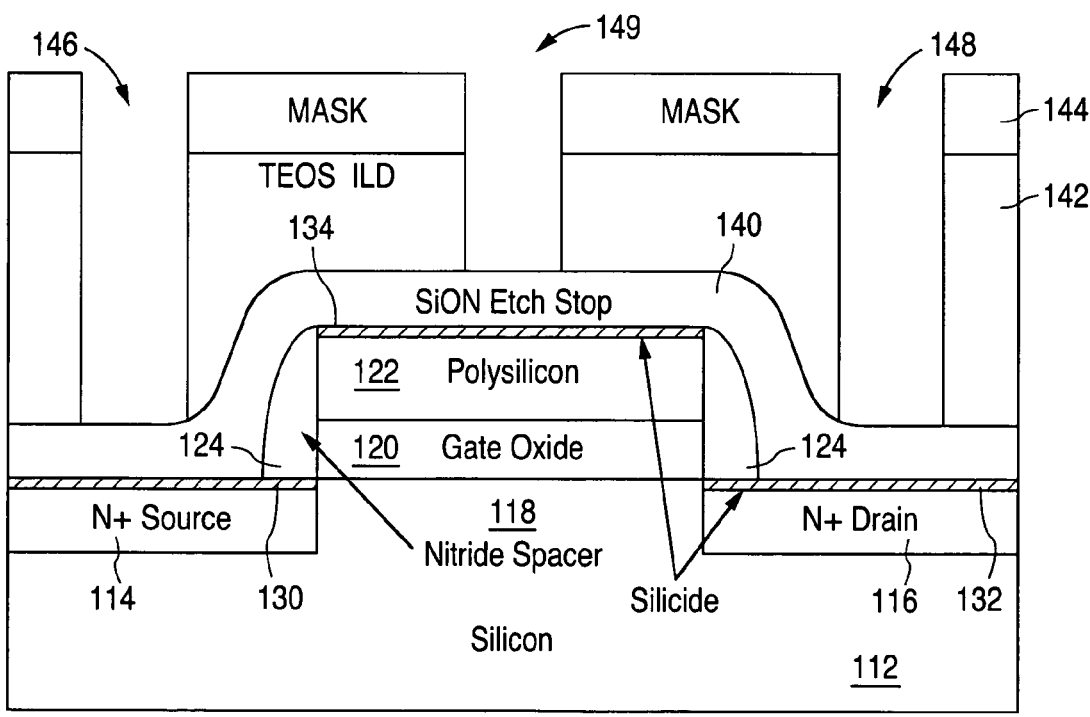
Figure 1C:
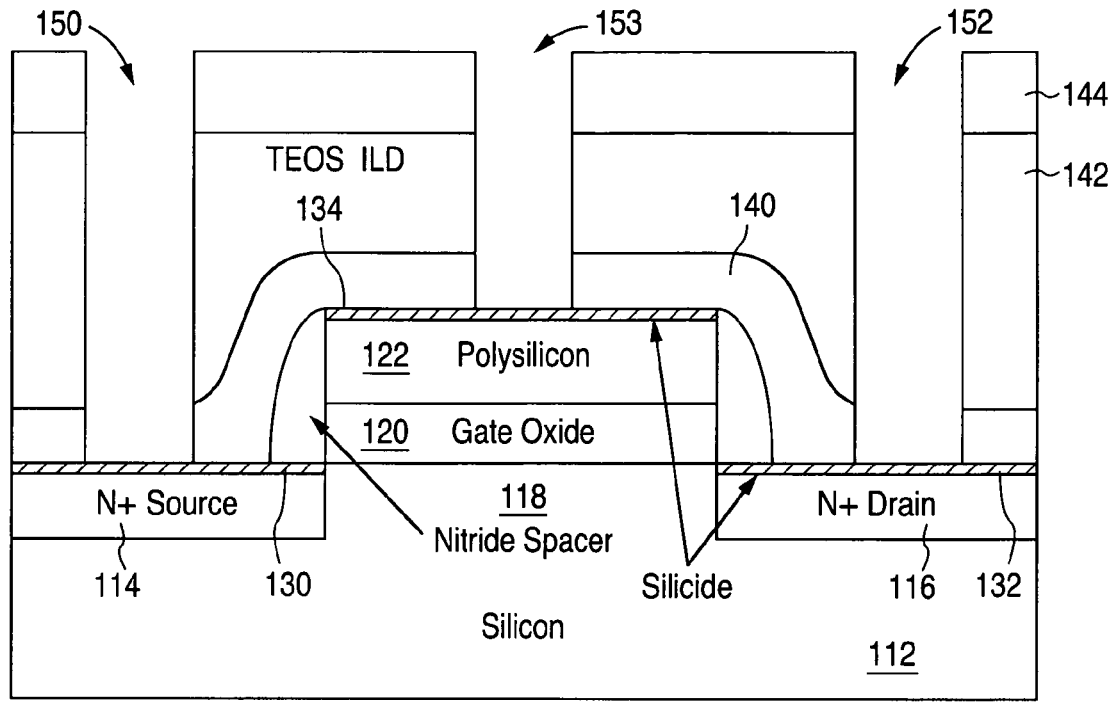
Figure 1D:
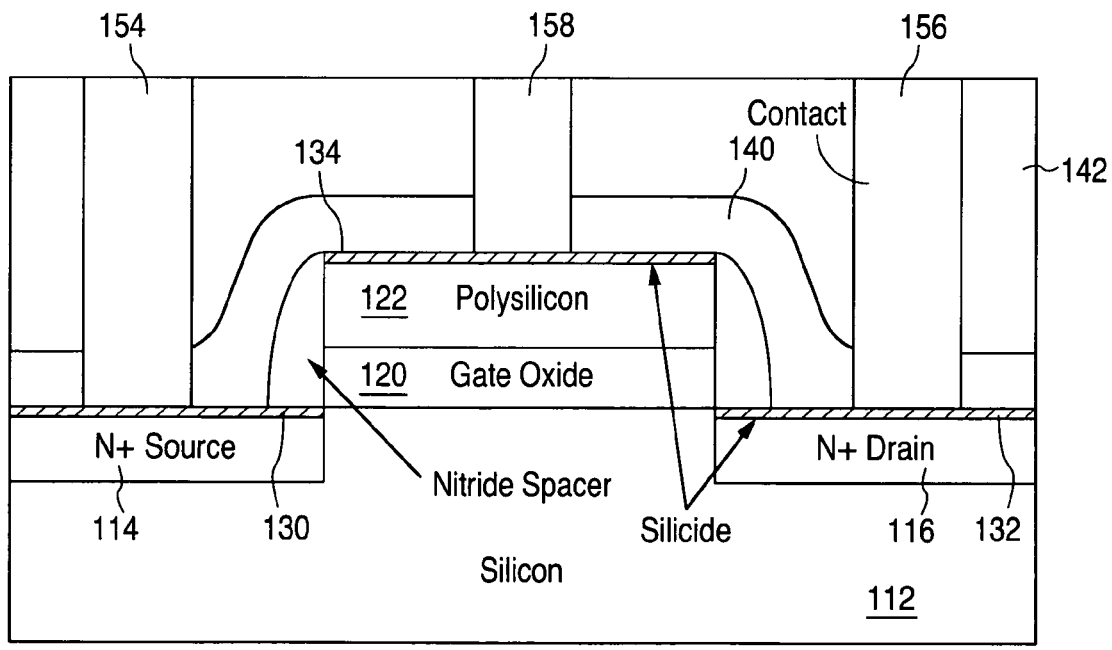
Figure 2:
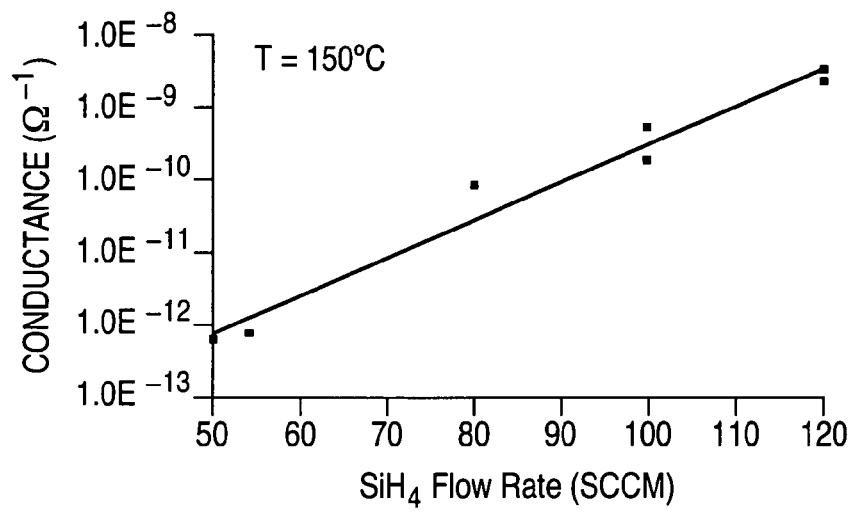
FIG. 2 is a prior-art graph illustrating SiON film conduction versus SiH$_4$ deposition flow rate.
Figure 3:
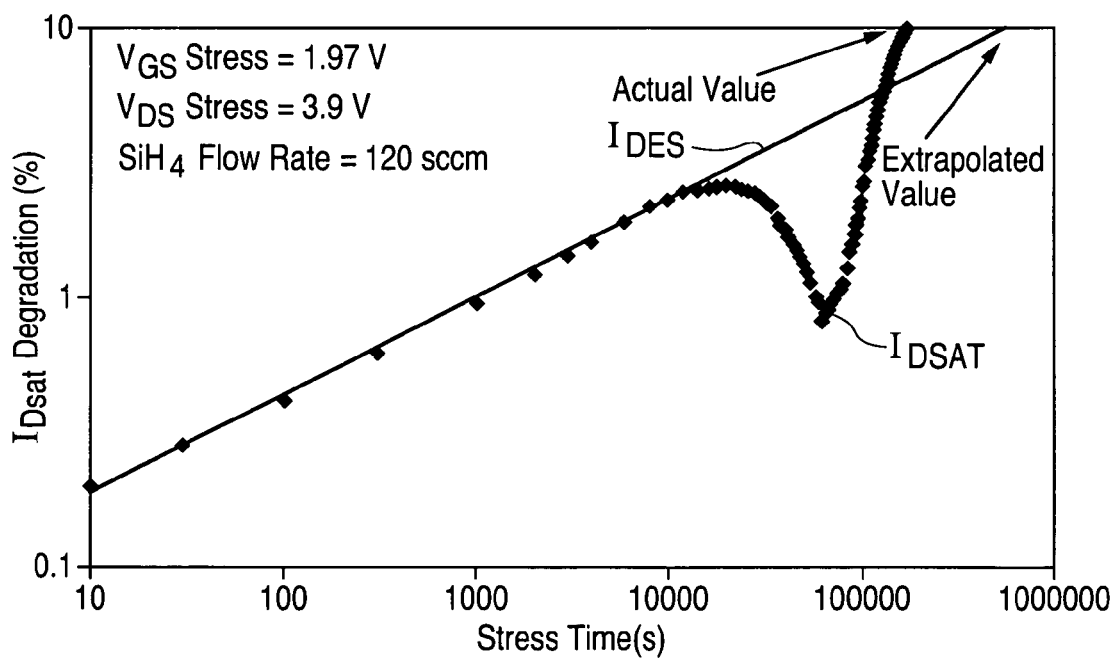
FIG. 3 is a prior-art graph illustrating the hot carrier degradation of an NMOS transistor fabricated with method 100 when using a SiH$_4$ flow rate of 120 sccm.
Figure 4:
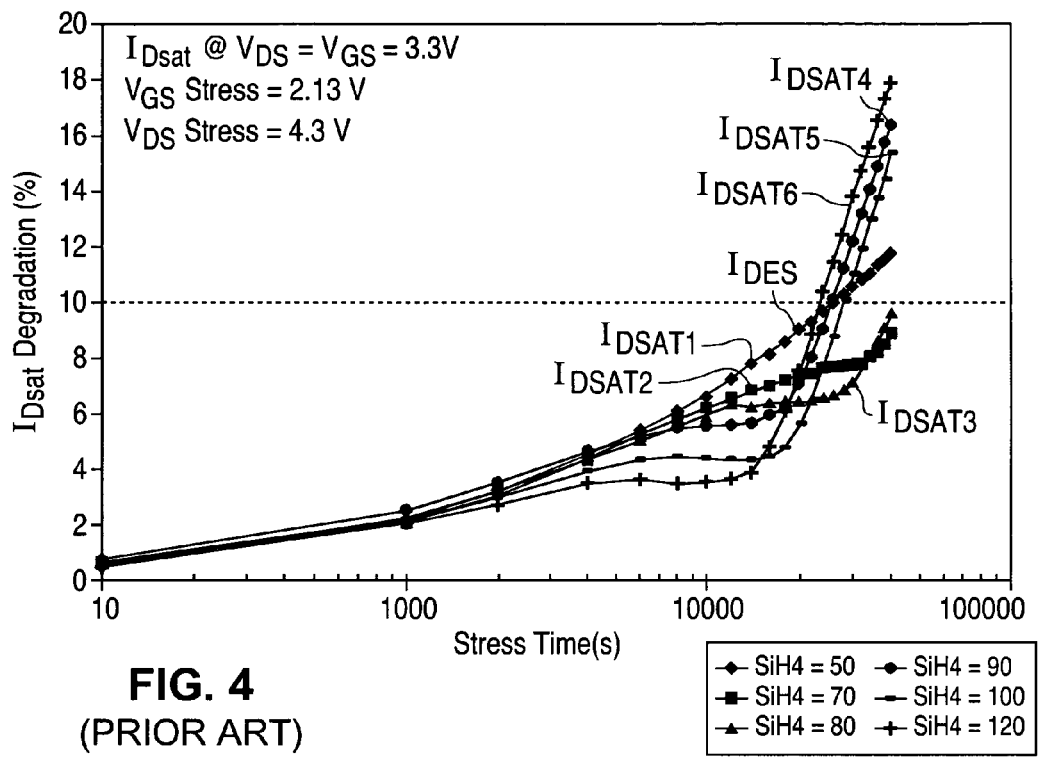
FIG. 4 is a prior-art graph illustrating an example of the hot carrier degradation of an NMOS transistor fabricated with a series of SiH$_4$ flow rate levels.

As shown in FIG. 2, $SiH_4$ deposition flow rates of approximately 110-120 sccm have conductivities of approximately $1 \times 10^{-9} \Omega^{-1}$. It is critical that the $SiH_4$ flow rate not fall below about 110 sccm because a smaller flow rate will lead to excessive resistance which, in turn, leaves the transistor susceptible to damage from a plasma induced charge on gate 122. It is also critical that the $SiH_4$ flow rate not exceed about 120 sccm because a higher flow rate will lead to excessive conductivity which, in turn, can lead to an excessive gate-to-source or gate-to-drain leakage current during normal operation.

In accordance with the present invention, by forming upper SiON etch stop layer 510B with, for example, a $SiH_4$ flow rate of 120 sccm, upper SiON layer 510B is formed with a large amount of hydrogen. As a result, upper SiON etch stop layer 510B is more conductive. Thus, once metal gate contact 158 is formed, a plasma induced charge on gate 122 is shorted to ground via the upper SiON etch stop layer 510B, thereby substantially reducing the effects of PID.

In addition, lower SiON layer 510A presents a barrier to the large amounts of hydrogen that are used when forming upper SiON etch stop layer 510B, which substantially prevents the hydrogen used in forming upper SiON layer 510B from passing through lower SiON etch stop layer 510A and forming Si—H bonds at the Si—$SiO_2$ interface. As a result, the large amounts of hydrogen used in forming upper SiON layer do not increase the hot carrier degradation of the transistor.

After SiON etch stop layer 510 has been formed, method 500 next forms dielectric layer 142 as above, and then continues with the same steps used in method 100 to produce the structure shown in FIG. 5B. Following this, method 500 continues with conventional steps.

Figure 6:
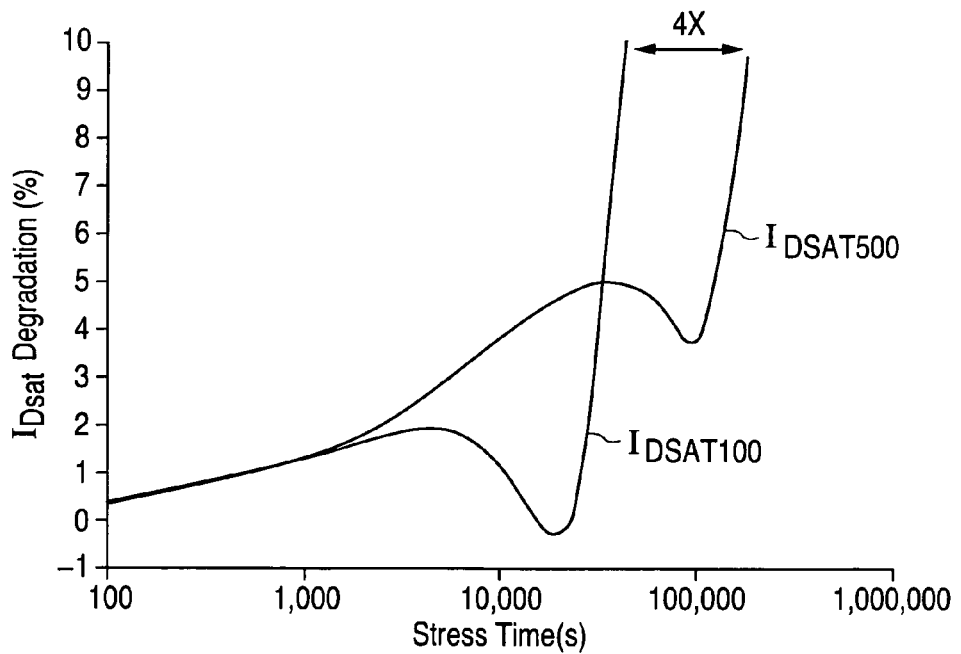
FIG. 6 is a graph illustrating the hot carrier degradation of NMOS transistors fabricated with method 100 when using a SiH$_4$ flow rate of 120 sccm, and with method 500 using a SiH$_4$ flow rate of 50 sccm followed by a SiH$_4$ flow rate of 120 sccm in accordance with the present invention.

FIG. 6 shows a graph that illustrates the hot carrier degradation of NMOS transistors fabricated with method 100 when using a $SiH_4$ flow rate of 120 sccm, and with method 500 using a $SiH_4$ flow rate of 50 sccm followed by a $SiH_4$ flow rate of 120 sccm in accordance with the present invention.

As shown in FIG. 6, the graph illustrates a measured saturated drain current $I_{DSAT100}$ that represents the results of method 100, and a measured saturated drain current $I_{DSAT500}$ that represents the results of method 500. (Further, the $I_{DSAT100}$ and $I_{DSAT500}$ values are measured at $V_{GS}=V_{DS}=3.3V$, and the device is stressed at $V_{GS}$ stress=1.97V and $V_{DS}$ stress=4.13V.)

As further shown in FIG. 6, by utilizing method 500 in lieu of method 100, the measured saturated drain current $I_{DSAT500}$ has a hot carrier reliability that is approximately 4× greater than the hot carrier reliability of the measured saturated drain current $I_{DSAT100}$ when failure is defined as a degradation of 10%.

It should be understood that the above descriptions are examples of the present invention, and that various alternatives of the invention described herein may be employed in practicing the invention. Thus, it is intended that the following claims define the scope of the invention and that structures and methods within the scope of these claims and their equivalents be covered thereby.

What is claimed is:

1. A method of forming a MOS transistor in a semiconductor material of a first conductivity type, the method comprising:
   forming a first etch stop layer with a first silane ($SiH_4$) flow rate over a source region, a drain region, and a gate of a transistor;
   forming a second etch stop layer with a second $SiH_4$ flow rate to touch the first etch stop layer, the second $SiH_4$ flow rate being greater than the first $SiH_4$ flow rate, the first etch stop layer and the second etch stop layer being silicon oxynitride (SiON); and
   forming a layer of insulation material over the second etch stop layer.

2. The method of claim 1 wherein the first $SiH_4$ flow rate lies in the range of 30-85 sccm.

3. The method of claim 2 wherein the second $SiH_4$ flow rate lies in the range of 110-120 sccm.

4. The method of claim 1 wherein the second $SiH_4$ flow rate lies in the range of 110-120 sccm.

5. A method of forming a MOS transistor in a semiconductor material of a first conductivity type, the method comprising:
   forming a first etch stop layer with a first silane ($SiH_4$) flow rate over a source region, a drain region, and a gate of a transistor;

forming a second etch stop layer with a second SiH$_4$ flow rate to touch the first etch stop layer, the second SiH$_4$ flow rate being greater than the first SiH$_4$ flow rate;

forming a layer of insulation material over the second etch stop layer; and selectively etching the layer of insulation material to form a plurality of first openings that expose regions on a top surface of the second etch stop layer.

6. The method of claim 5 and further comprising selectively etching the second etch stop layer and the first etch stop layer to form openings that extend through the first and second etch stop layers.

7. A MOS transistor formed in a semiconductor material of a first conductivity type, the MOS transistor comprising:

spaced-apart source and drain regions of a second conductivity type;

a channel region that lies between the source and drain regions;

a layer of insulation material that lies over the channel region;

a gate that lies on the layer of insulation material over the channel region;

a first etch stop layer formed over the source region, the drain region, and the gate;

a second etch stop layer that touches the first etch stop layer, the second etch stop layer being more conductive than the first etch stop layer, the first etch stop layer and the second etch stop layer being silicon oxynitride (SiON); and a layer of insulation material that lies over the second etch stop layer.

8. The MOS transistor of claim 7 wherein the first etch stop layer is an order of magnitude or more less conductive than the second etch stop layer.

9. The method of claim 7 wherein the layer of insulation material touches the second etch stop layer.

10. The MOS transistor of claim 9 and further comprising:

a source metal contact that makes an electrical connection to the source region, and touches the first etch stop layer, the second etch stop layer, and the layer of insulation material; and a drain metal contact that makes an electrical connection to the source region, and touches the first etch stop layer, the second etch stop layer, and the layer of insulation material.

11. The method of claim 1 wherein the layer of insulation material touches the second etch stop layer.

12. The method of claim 11 and further comprising:

selectively etching the layer of insulation material to form a plurality of first openings that expose regions on a top surface of the second etch stop layer;

selectively etching the second etch stop layer and the first etch stop layer through the plurality of openings to form openings than extend through the first and second etch stop layers;

forming a source metal contact in an opening that extends through the first and second etch stop layers to make an electrical connection with the source region, and touch the first etch stop layer and the second etch stop layer; and forming a drain metal contact in an opening that extends through the first and second etch stop layers to make an electrical connection with the drain region, and touch the first etch stop layer and the second etch stop layer.

13. The method of claim 12 wherein the first SiH$_4$ flow rate lies in the range of 30-85 sccm.

14. The method of claim 13 wherein the second SiH$_4$ flow rate lies in the range of 110-120 sccm.

15. The method of claim 12 wherein the second SiH$_4$ flow rate lies in the range of 110-120 sccm.

16. The method of claim 5 wherein the first SiH$_4$ flow rate lies in the range of 30-85 sccm.

17. The method of claim 16 wherein the second SiH$_4$ flow rate lies in the range of 110-120 sccm.

18. The method of claim 5 wherein the second SiH$_4$ flow rate lies in the range of 110-120 sccm.

19. The method of claim 5 wherein the layer of insulation material touches the second etch stop layer.

20. The method of claim 6 and further comprising:

forming a source metal contact in an opening that extends through the first and second etch stop layers to make an electrical connection with the source region, and touch the first etch stop layer and the second etch stop layer; and forming a drain metal contact in an opening that extends through the first and second etch stop layers to make an electrical connection with the drain region, and touch the first etch stop layer and the second etch stop layer.

* * * * *